US008758977B2

(12) United States Patent
Minegishi

(10) Patent No.: US 8,758,977 B2
(45) Date of Patent: Jun. 24, 2014

(54) NEGATIVE-TYPE PHOTOSENSITIVE RESIN COMPOSITION, PATTERN FORMING METHOD AND ELECTRONIC PARTS

(75) Inventor: Tomonori Minegishi, Ibaraki (JP)

(73) Assignee: Hitachi Chemical DuPont MicroSystems, Ltd., Tokyo (JP)

( * ) Notice: Subject to any disclaimer, the term of this patent is extended or adjusted under 35 U.S.C. 154(b) by 99 days.

(21) Appl. No.: 13/006,300

(22) Filed: Jan. 13, 2011

(65) Prior Publication Data

US 2011/0171436 A1 Jul. 14, 2011

Related U.S. Application Data

(62) Division of application No. 12/067,911, filed as application No. PCT/JP2006/312357 on Jun. 20, 2006.

(30) Foreign Application Priority Data

Sep. 22, 2005 (JP) .................. 2005-276496

(51) Int. Cl.
*G03F 7/023* (2006.01)
*G03F 7/038* (2006.01)
*G03F 7/38* (2006.01)

(52) U.S. Cl.
CPC ............ *G03F 7/0387* (2013.01); *G03F 7/0233* (2013.01); *G03F 7/38* (2013.01)
USPC .......... 430/270.1; 430/18; 430/191; 430/192; 430/193; 430/325; 430/330

(58) Field of Classification Search
CPC ........ G03F 7/0387; G03F 7/0233; G03F 7/38
USPC ......... 430/326, 330, 18, 270.1, 191, 192, 193
See application file for complete search history.

(56) References Cited

U.S. PATENT DOCUMENTS

| | | | |
|---|---|---|---|
| 3,957,512 A | 5/1976 | Kleeberg et al. | |
| 4,040,831 A | 8/1977 | Rubner et al. | |
| 4,093,461 A | 6/1978 | Loprest et al. | |
| RE30,186 E | 1/1980 | Rubner et al. | |
| 4,339,521 A | 7/1982 | Ahne et al. | |
| 4,395,482 A | 7/1983 | Ahne et al. | |
| 4,629,777 A | 12/1986 | Pfeifer | |
| 4,657,832 A | 4/1987 | Pfeifer | |
| 4,927,736 A | 5/1990 | Mueller et al. | |
| 5,019,488 A | 5/1991 | Mammato et al. | |
| 5,037,720 A | 8/1991 | Khanna | |
| 5,106,720 A | 4/1992 | Mueller et al. | |
| 5,342,739 A | 8/1994 | Katou et al. | |
| 5,486,447 A | 1/1996 | Hammerschmidt et al. | |
| 5,738,915 A | 4/1998 | Fathi et al. | |
| 6,143,467 A | 11/2000 | Hsu et al. | |
| 6,338,931 B1 | 1/2002 | Maeda et al. | |
| 6,576,394 B1 | 6/2003 | Xu et al. | |
| 6,884,567 B2 | 4/2005 | Sezi | |
| 6,887,643 B2 * | 5/2005 | Fujita et al. .................. 430/191 |
| 6,929,891 B2 * | 8/2005 | Rushkin et al. ............... 430/18 |
| 6,933,087 B2 | 8/2005 | Suwa et al. | |
| 7,049,371 B2 | 5/2006 | Enoki et al. | |
| 7,129,011 B2 | 10/2006 | Rushkin et al. | |
| 7,132,205 B2 | 11/2006 | Rushkin et al. | |
| 7,435,525 B2 | 10/2008 | Hattori et al. | |
| 7,485,405 B2 | 2/2009 | Kato et al. | |
| 7,615,331 B2 | 11/2009 | Yamanaka et al. | |
| 7,803,510 B2 | 9/2010 | Naiini et al. | |
| 2001/0031419 A1 | 10/2001 | Nunomura et al. | |
| 2002/0115741 A1 | 8/2002 | Kobayashi et al. | |
| 2003/0022109 A1 | 1/2003 | Kobayashi | |
| 2003/0194631 A1 | 10/2003 | Suwa et al. | |
| 2004/0110084 A1 | 6/2004 | Inomata et al. | |
| 2004/0142275 A1 * | 7/2004 | Komatsu .................. 430/270.1 |
| 2004/0229166 A1 | 11/2004 | Rushkin et al. | |
| 2004/0253537 A1 | 12/2004 | Rushkin et al. | |
| 2006/0079658 A1 | 4/2006 | Kato et al. | |
| 2006/0110680 A1 | 5/2006 | Taniguchi et al. | |
| 2006/0199920 A1 | 9/2006 | Okada et al. | |
| 2007/0122733 A1 | 5/2007 | Hattori et al. | |

FOREIGN PATENT DOCUMENTS

| | | |
|---|---|---|
| JP | SHO490115541 | 2/1974 |
| JP | 49-115541 | 11/1974 |
| JP | 51-40922 | 4/1976 |
| JP | 52-13315 A | 2/1977 |

(Continued)

OTHER PUBLICATIONS

Office Action in co-pending U.S. Appl. No. 12/067,911 mailed Jun. 8, 2011.
Machine translation of previously submitted JP 2002-249646 (no date).
Machine translation of above cited JP 2007-322935 (no date).
Office Action in U.S. Appl. No. 12/531,055 dated Dec. 9, 2011.
Office Action in U.S. Appl. No. 12/067,911 dated Dec. 16, 2011.
Office Action in U.S. Appl. No. 13/305,668 dated Jan. 30, 2012.
Office Action in U.S. Appl. No. 12/531,055 dated Jan. 12, 2012.
International Search Report issued in corresponding application No. PCT/JP2006/312358, completed Aug. 10, 2006 and mailed Aug. 22, 2006.

(Continued)

*Primary Examiner* — John Chu
(74) *Attorney, Agent, or Firm* — Griffin & Szipl, P.C.

(57) ABSTRACT

A negative-type photosensitive resin composition which is good in sensitivity and resolution, a pattern forming method by the use thereof wherein a pattern which can be developed in an alkali aqueous solution, is excellent in sensitivity, resolution and heat resistance and has a good shape is obtained, and highly reliable electronic parts are provided. The negative-type photosensitive rein composition includes (a) a polymer that has a phenolic hydroxyl group at a terminal and is soluble in the alkali aqueous solution, (b) a compound that generates an acid by irradiating active light, and (c) a compound that can be crosslinked or polymerized by an action of the acid.

14 Claims, 3 Drawing Sheets

(56) References Cited

FOREIGN PATENT DOCUMENTS

| | | |
|---|---|---|
| JP | 54-145794 | 11/1979 |
| JP | 56-038038 | 4/1981 |
| JP | 59-108031 A | 6/1984 |
| JP | 59-132122 | 7/1984 |
| JP | 59-219330 A | 12/1984 |
| JP | 59-220730 A | 12/1984 |
| JP | 59-231533 A | 12/1984 |
| JP | 59-232122 A | 12/1984 |
| JP | 60-006729 A | 1/1985 |
| JP | 60-072925 A | 4/1985 |
| JP | 61-057620 A | 3/1986 |
| JP | 64-46862 | 3/1989 |
| JP | 64-60630 A | 3/1989 |
| JP | 1-46862 B2 | 10/1989 |
| JP | 03-000763 A | 1/1991 |
| JP | 3-58048 | 3/1991 |
| JP | 3-259148 | 11/1991 |
| JP | 04-031861 A | 2/1992 |
| JP | 04-046345 A | 2/1992 |
| JP | 5-410922 | 6/1993 |
| JP | 05-197153 A | 8/1993 |
| JP | 5-213315 | 8/1993 |
| JP | 6072925 | 3/1994 |
| JP | 6-157620 | 6/1994 |
| JP | 07-219228 A | 8/1995 |
| JP | 2587148 | 12/1996 |
| JP | 09-183846 A | 7/1997 |
| JP | 10-186664 A | 7/1998 |
| JP | 10-195294 | 7/1998 |
| JP | 10-282668 A | 10/1998 |
| JP | 10-307393 A | 11/1998 |
| JP | 11-149161 | 6/1999 |
| JP | 11-153866 A | 6/1999 |
| JP | 11-202488 | 7/1999 |
| JP | 11-202489 A | 7/1999 |
| JP | 11-254850 A | 9/1999 |
| JP | 3031434 | 2/2000 |
| JP | 2000-147764 A1 | 5/2000 |
| JP | 2000-199957 | 7/2000 |
| JP | 2000-250209 | 9/2000 |
| JP | 2001-033964 A | 2/2001 |
| JP | 2001-056559 A | 2/2001 |
| JP | 2001-125267 A | 5/2001 |
| JP | 2001-183835 A | 7/2001 |
| JP | 2001-194791 A | 7/2001 |
| JP | 2001-249454 | 9/2001 |
| JP | 2001-255666 A | 9/2001 |
| JP | 2001-312051 | 11/2001 |
| JP | 2002-139835 A | 5/2002 |
| JP | 2002-169286 A | 6/2002 |
| JP | 2002-526793 A | 8/2002 |
| JP | 2002-249646 A | 9/2002 |
| JP | 2002-328472 | 11/2002 |
| JP | 2003-121998 A | 4/2003 |
| JP | 2003-215802 A | 7/2003 |
| JP | 2004-503830 A | 2/2004 |
| JP | 2004-94118 | 3/2004 |
| JP | 2004-219813 A | 8/2004 |
| JP | 2004-325616 A | 11/2004 |
| JP | 2006-133757 A | 5/2006 |
| JP | 2006-178059 | 7/2006 |
| JP | 2006-189788 | 7/2006 |
| JP | 2006-285037 A | 10/2006 |
| JP | 2006-349700 | 12/2006 |
| JP | 2007-156243 A | 6/2007 |
| JP | 2007-183388 A | 7/2007 |
| JP | 2007-212602 | 8/2007 |
| JP | 2007-240554 A | 9/2007 |
| JP | 2007-246440 | 9/2007 |
| JP | 2007-256525 A | 10/2007 |
| JP | 2007-322935 A | 12/2007 |
| WO | 00-19273 | 4/2000 |
| WO | 01-96960 A1 | 12/2001 |
| WO | 2004/081664 A2 | 9/2004 |
| WO | 2005-109099 A1 | 11/2005 |
| WO | 2007-034604 | 3/2007 |

OTHER PUBLICATIONS

International Search Report, issued in corresponding application No. PCT/JP2008/054008, completed Mar. 21, 2008, mailed Apr. 1, 2008.
International Search Report, issued in corresponding application No. PCT/JP2008/069652, completed Nov. 18, 2008, mailed Dec. 2, 2008.
Office Action in U.S. Appl. No. 13/305,668 mailed Oct. 17, 2011.
Okuda, R., et al., "Polyimide Coatings for OLED Applications," Journal of Photopolymer Science and Technology, vol. 17, No. 2, 2004, pp. 207-214.
Ueda, Mitsuru, et al. "A New Negative-Type Photosensitive Polymide Based on Poly(hydroxyimide), a Cross-Linker, and a Photoacid Generator," Macromolecules, 29, 1996, pp. 6427-6431.
Watanabe, Yasufumi et al., "Three-Component Negative-Type Photosensitive Polyimide Precursor Based on Poly (amid acid), a Crosslinker, and a Photoacid Generator," Journal of Polymer Science: Part A: Polymer Chemistrym vol. 43, 2005, pp. 593-599.
Watanabe, Yasufumi, et al. "New Negative-Type Photosensitive Alkaline-developable Semi-aromatic Polymides with Low Dielectric Constants Based on Poly(amic acid) from Aromatic Diamine Containing Adamantyl Units and Alicyclic Dianhydrides, A Cross-linker, and A Photoacid Generator," Polymer Journal, vol. 37, 2005, pp. 270-276.
Yoshio Imai et al., "Saishin Polyimide-Kiso to Ouyou," Nippon Polyimide Kenkyukai, citing Characteristics of Polyimide as Electronic Material, Jan. 2002.
Espacenet Bibliographic data corresponding to JP 2007-322935 (2008), last updated Mar. 14, 2012. (Filed in co-pending U.S. Appl. No. 12/531,055 on Mar. 8, 2012 with Amendment B as Exhibit A1).
Espacenet Bibliographic data corresponding to the JP 2002-249626, last updated Mar. 14, 2012 (Filed in co-pending U.S. Appl. No. 12/531,055 on Mar. 8, 2012 with Amendment B as Exhibit B1).
JP 2002-249646 A (Filed in co-pending U.S. Appl. No. 12/531,055 on Mar. 8, 2012 with Amendment B as Exhibit C1).
Extended European Search Report issued in related application 08721728.4, completed Jun. 29, 2012 and mailed Jul. 11, 2012.
Notice of Rejection issued in co-pending related Japanese application 2008-278104 on Aug. 15, 2012 and mailed Aug. 21, 2012.
Notice of Rejection issued in co-pending related Japanese application 2008-278105 on Aug. 15, 2012 and mailed Aug. 21, 2012.
Notice of Rejection issued in co-pending related Japanese application 2009-539089 on Aug. 15, 2012 and mailed Aug. 21, 2012.
Office Action of U.S. Appl. No. 12/067,911, dated Sep. 17, 2010, Exhibit A.
Shigeru Kubota et al., "Positive Photoreactive Polyimides. II. Preparation and Characterization of Polyimide Precursors Containing α-[2-Nitrophenyl]Ethyl Ester Side Chains," J. Macromol. Sci.-Chem., A24 (12), pp. 1407-1422, (1987).
Toshihiko Omote et al., "Fluorine-Containing Photoreactive Polyimides. 7, Photochemical Reaction of Pendant 1,2-Naphthoquinone Diazide Moieties in Novel Photoreactive Polyimides," Macromolecules 1990, 23, pp. 4796-4802.
Partial English Translation of Office Action issued in corresponding Japanese Application No. 2005-276496, mailed Feb. 23, 2010.
International Search Report issued in the corresponding Japanese Application No. PCT/JP2006/312357, completed Jul. 12, 2006 and mailed on Jul. 25, 2006.
Written Opinion of the International Searching Authority (PCT/ISA/237) issued in corresponding application No. PCT/JP2006/312357 dated Jul. 25, 2006.
Office Action in U.S. Appl. No. 12/739,127 dated May 11, 2012.
Office Action issued in co-pending related U.S. Appl. No. 12/067,911 on Aug. 20, 2012.

\* cited by examiner

NEGATIVE-TYPE PHOTOSENSITIVE RESIN COMPOSITION, PATTERN FORMING METHOD AND ELECTRONIC PARTS

This is a Divisional application of U.S. patent application Ser. No. 12/067,991 filed on Mar. 24, 2008, which is a National Phase Application in the United States of International Patent Application No. PCT/JP2006/312357 filed Jun. 20, 2006, which claims priority on Japanese Patent Application No. 2005-276496, filed Sep. 22, 2005. The entire disclosures of the above patent applications are hereby incorporated by reference. The entire disclosures of Japanese Patent Application Nos. 2004-283962 (filed Sep. 29, 2004) and 2004-354071 (filed Dec. 7, 2004) are also hereby incorporated by reference.

TECHNICAL FIELD

The present invention relates to a negative-type photosensitive resin composition, a pattern forming method and electronic parts, in particular, a heat-resistant negative-type photosensitive resin composition which contains a heat-resistant macromolecule having a photosensitivity and is excellent in sensitivity, resolution and heat resistance, a pattern forming method and electric parts by the use thereof.

BACKGROUND ART

Conventionally, polyimide resins collectively having an excellent heat resistance, electric property and mechanical property have been used for surface protection films and interlayer insulation films for semiconductor devices. However, while the semiconductor devices have been highly integrated and grown in size in recent years, it has been required to make sealing resin packages thinner and smaller, and systems such as surface mounting by LOC (lead on chip) and solder reflow have been employed. Thus, the polyimide resins which are ever more excellent in mechanical property and heat resistance have been needed.

Meanwhile, photosensitive polyimide obtained by imparting a photosensitive property to the polyimide resin itself has been used, and the use of this has characteristics that a pattern making process can be simplified and a complicated manufacture process can be shortened. Heat-resistant photoresists using conventional photosensitive polyimide or a precursor thereof, and their intended uses are well-known. In negative-types, the method in which a methacryloyl group is introduced into a polyimide precursor via an ester bond or an ion bond (see e.g., Patent Documents 1 to 4), soluble polyimide having photopolymerizable olefin (see e.g., Patent Documents 5 to 10), and self-sensitizing type polyimide having a benzophenone skeleton and having an alkyl group at an ortho position of an aromatic ring to which a nitrogen atom is bound (see e.g., Patent Documents 11 and 12) are available.

In the above negative-type, an organic solvent such as N-methylpyrrolidone is needed upon development. Thus, recently positive-type photosensitive resins which can be developed in an alkali aqueous solution have been proposed. In the positive-types, the method in which an o-nitrobenzyl group is introduced into the polyimide precursor via the ester bond (see, e.g., Nonpatent Literature 1), the method in which a naphthoquinone diazide compound is mixed with a soluble hydroxylimide or a polyoxazole precursor (see e.g., Patent Documents 13 and 14), the method in which naphthoquinone diazide is introduced into soluble polyimide via the ester bond (see e.g., Nonpatent Literature 2) and the method in which naphthoquinone diazide is mixed with a polyimide precursor (see e.g., Patent Document 15) are available.

However, the above negative-types functionally have a problem in resolution and a problem in that a yield ratio upon production is reduced depending on the intended use. In the above, the structure of the polymer to be used is limited, thus, a physical property of a finally obtained coat is also limited, and they are not suitable for multipurpose uses. Meanwhile, also in the positive-types, the sensitivity and the resolution are low owing to an absorption wavelength of a photosensitizer as the above, and the structure is limited. Thus, the positive-types have the similar problems.

Those obtained by mixing a diazonaphthoquinone compound with a polybenzoxazole precursor (see e.g., Patent Document 16), those in which a phenolic hydroxyl group has been introduced in place of carboxylic acid, such as those in which a phenol moiety has been introduced into polyamic acid via the ester bond (see e.g., Patent Document 17) are also available. However, in these, a development property is insufficient, and film thickness loss in an unexposed region and detachment of the resin from the substrate occur. For the purpose of improving such a development property and adhesiveness, those obtained by mixing polyamic acid having a siloxane moiety in a polymer skeleton (see e.g., Patent Documents 18 and 19) have been proposed, but a storage stability is deteriorated because of using polyamic acid as described above. In addition, those in which an amine terminal group is sealed with a polymerizable group for the purpose of improving the storage stability and the adhesiveness (see e.g., Patent Documents 20 to 22) are also proposed. However, they have the low sensitivity because a diazoquinone compound abundantly containing aromatic rings is used as an acid generator. An amount of the diazoquinone compound to be added is necessary to be increased. Thus, the mechanical property after being cured is remarkably decreased. Therefore, it is difficult to say that they are materials at practical levels.

[Patent Document 1] Japanese Patent Application Laid-Open No. S49-115541
[Patent Document 2] Japanese Patent Application Laid-Open No. S51-40922
[Patent Document 3] Japanese Patent Application Laid-Open No. S54-145794
[Patent Document 4] Japanese Patent Application Laid-Open No. S56-38038
[Patent Document 5] Japanese Patent Application Laid-Open No. S59-108031
[Patent Document 6] Japanese Patent Application Laid-Open No. S59-220730
[Patent Document 7] Japanese Patent Application Laid-Open No. S59-232122
[Patent Document 8] Japanese Patent Application Laid-Open No. S60-6729
[Patent Document 9] Japanese Patent Application Laid-Open No. S60-72925
[Patent Document 10] Japanese Patent Application Laid-Open No. S61-57620
[Patent Document 11] Japanese Patent Application Laid-Open No. S59-219330
[Patent Document 12] Japanese Patent Application Laid-Open No. S59-231533
[Patent Document 13] Japanese Patent Application Laid-Open No. S64-60630
[Patent Document 14] U.S. Pat. No. 4,395,482 Specification
[Patent Document 15] Japanese Patent Application Laid-Open No. S52-13315
[Patent Document 16] Japanese Patent Publication No. H1-46862

[Patent Document 17] Japanese Patent Application Laid-Open No. H10-307393
[Patent Document 18] Japanese Patent Application Laid-Open No. H4-31861
[Patent Document 19] Japanese Patent Application Laid-Open No. H4-46345
[Patent Document 20] Japanese Patent Application Laid-Open No. H5-197153
[Patent Document 21] Japanese Patent Application Laid-Open No. H9-183846
[Patent Document 22] Japanese Patent Application Laid-Open No. 2001-183835
[Patent Document 23] Japanese Patent Application Laid-Open No. H3-763
[Patent Document 24] Japanese Patent Application Laid-Open No. H7-219228
[Patent Document 25] Japanese Patent Application Laid-Open No. H10-186664
[Patent Document 26] Japanese Patent Application Laid-Open No. H11-202489
[Patent Document 27] Japanese Patent Application Laid-Open No. 2001-56559
[Patent Document 28] Japanese Patent Application Laid-Open No. 2001-194791
[Patent Document 29] Japanese Patent Application Laid-Open No. Hyo 2002-526793
[Patent Document 30] U.S. Pat. No. 6,143,467 Specification
[Patent Document 31] Japanese Patent Application Laid-Open No. 2001-125267
[Nonpatent Literature 1] J. Macromol. Sci. Chem., A24, 12, 1407 (1987)
[Nonpatent Literature 2] Macromolecules, 23, 4796 (1990)

DISCLOSURE OF INVENTION

Problem to be Solved by the Invention

Those to which various chemical amplification systems are applied have been proposed for the purpose of improving the problems in the diazoquinone compound. These may include chemically amplified type polyimide (see e.g., Patent Document 23), chemically amplified type polyimide or polybenzoxazole precursors (see e.g., Patent Documents 24 to 30). However, in these, when the sensitivity is high, the film property is decreased due to a low molecular weight, and when the film property is excellent, the sensitivity is decreased because a solubility is insufficient due to a high molecular weight. Any of them is hardly said to be materials at practical levels. Those utilizing the negative-type chemical amplification system using a crosslinking reaction which progresses in the presence of an acid catalyst (see e.g., the above Patent Documents 17 and 31) have been also proposed, but a hydroxyl group in their molecular chain is a crosslinking point in these, a crosslinking efficiency is actually low and they do not have the high sensitivity. Therefore, it has been an actual circumstance that any of them are insufficient at practical levels.

The present invention has been made for solving the conventional problems as the above, and an object of the present invention is to provide a heat-resistant negative-type photosensitive resin composition which is also good in sensitivity and resolution.

Another object of the present invention is to provide a pattern forming method for obtaining a pattern having a good shape, which can be developed in an alkali aqueous solution and is excellent in sensitivity, resolution and heat resistance, by the use of the negative-type photosensitive resin composition. Furthermore, another object of the present invention is to provide highly reliable electronic parts by providing the pattern having the good shape and properties.

Means for Solving Problem/Summary of the Invention

Namely, a negative-type photosensitive resin composition according to the present invention includes (a) a polymer that has a phenolic hydroxyl group at a terminal thereof and is soluble in an alkali aqueous solution; (b) a compound that generates an acid by irradiating active light; and (c) a compound that can be crosslinked or polymerized by an action of the acid.

In the negative-type photosensitive resin composition according to the present invention, the component (a) is at least one heat-resistant polymer compound selected from the group consisting of polyimide, polyoxazole, polyamideimide, polyamide, polyamic acid, polyamic acid ester and polyhydroxyamide.

In the negative-type photosensitive resin composition according to the present invention, the component (c) is a compound having at least one methylol group or alkoxyalkyl group in a molecule.

In the negative-type photosensitive resin composition according to the present invention, the component (c) is a compound represented by a general formula (I):

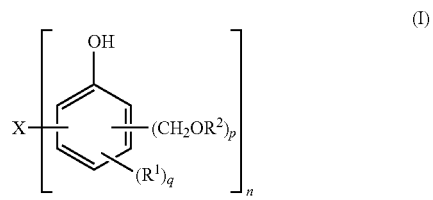

wherein X represents a single bond or a monovalent to tetravalent organic group; $R^1$ in number q each independently represent a monovalent organic group; $R^2$ in number p each independently represent a hydrogen atom or a monovalent organic group, n is an integer of 1 to 4; and p and q are each independently integers of 0 to 4.

In the negative-type photosensitive resin composition according to the present invention, the component (c) is a compound represented by the general formula (II):

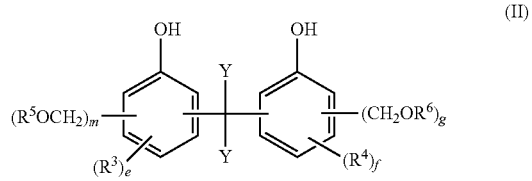

wherein two Y each independently represent a hydrogen atom or an alkyl group having 1 to 10 carbon atoms, an oxygen atom or a fluorine atom; $R^3$ and $R^4$ each independently represent a hydrogen atom; $R^5$ and $R^6$ each independently represent a hydrogen atom or a monovalent organic group; m and g each independently represent integers of 1 to 3; and e and f each independently represent integers of 0 to 4.

In the negative-type photosensitive resin composition according to the present invention, the component (c) is a compound represented by a general formula (III):

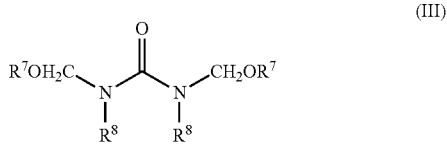

(III)

wherein multiple $R^7$ and $R^8$ each independently represent a hydrogen atom or a monovalent organic group.

In the negative-type photosensitive resin composition according to the present invention, 0.01 to 50 parts by weight of the compound (b) and 0.1 to 50 parts by weight of the component (c) are blended to 100 parts by weight of the component (a).

A pattern forming method according to the present invention includes the steps of applying the negative-type photosensitive resin composition on a support substrate and drying it to form a photosensitive resin film; exposing the photosensitive resin film obtained from the applying and drying; heating the photosensitive resin film after the exposing; developing the photosensitive resin film after the heating using an alkali aqueous solution; and heat-treating the photosensitive resin film after the developing.

Electronic parts according to the present invention have a pattern layer obtained by the pattern forming method as an interlayer insulation film layer or a surface protection layer.

Effect of the Invention

The negative-type photosensitive resin composition according to the present invention is excellent in sensitivity, resolution and heat resistance. Even when the negative-type photosensitive resin composition according to the present invention is thermally cured at low temperature of 200 to 300° C., a good cured film property is obtained. Additionally, shrinkage of the film due to a cure is small.

According to the pattern forming method of the present invention, the pattern which is excellent in sensitivity, resolution and heat resistance and has the good shape is obtained by the use of the negative-type photosensitive resin composition.

Furthermore, the electronic parts according to the present invention have the effect that the highly reliable electronic parts are obtained by having the pattern having the good shape and properties as a surface protection film layer or an interlayer insulation film layer of a circuit.

BRIEF DESCRIPTION OF DRAWINGS

FIG. 1-2 is a schematic sectional view for explaining a production process of a semiconductor apparatus having a multilayer wiring structure according to an embodiment according to the present invention.

FIG. 1-3 is a schematic sectional view for explaining a production process of a semiconductor apparatus having a multilayer wiring structure according to an embodiment according to the present invention.

FIG. 1-4 is a schematic sectional view for explaining a production process of a semiconductor apparatus having a multilayer wiring structure according to an embodiment according to the present invention.

FIG. 1-5 is a schematic sectional view for explaining a production process of a semiconductor apparatus having a multilayer wiring structure according to an embodiment according to the present invention.

FIG. 2 is a schematic sectional view illustrating electrinic parts fabricated in Examples 8 to 9 and a Comparative Example 3.

EXPLANATIONS OF LETTERS OR NUMERALS

Figure 1:
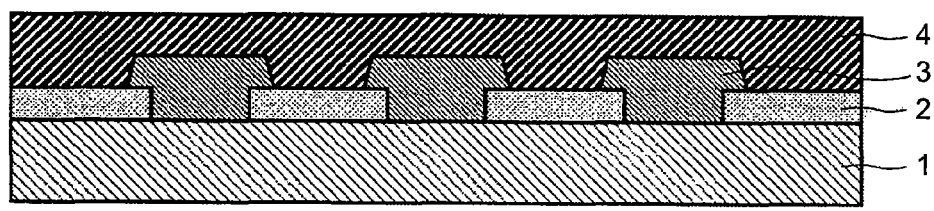
FIG. 1-1 is a schematic sectional view for explaining a production process of a semiconductor apparatus having a multilayer wiring structure according to an embodiment according to the present invention.

1 Semiconductor substrate
2 Protection film
3 First conductor layer
4 Interlayer insulation film layer
5 Photosensitive resin layer
6A, 6B, 6C, 6D Windows
7 Second conductor layer
8 Surface protection film layer
9 Conductor layer

BEST MODES FOR CARRYING OUT THE INVENTION

Embodiments of the negative-type photosensitive resin composition, the pattern forming method and the electronic parts according to the present invention will be described in detail based on the drawings. The present invention is not limited to these embodiments.

[Negative-Type Photosensitive Resin Composition]

First, the negative-type photosensitive resin composition according to the present invention will be described.

The negative-type photosensitive resin composition according to the present invention contains (a) a polymer soluble in an alkali aqueous solution having a phenolic hydroxyl group at a terminal, (b) a compound which generates an acid by irradiation of active light, and (c) a compound capable of being crosslinked or polymerized by an action of the acid.

The present invention can provide the heat-resistant negative-type photosensitive resin composition which can respond sufficiently even if a heat-resistant polymer [component (a)] imparting a photosensitivity has any structure, and furthermore is good in sensitivity and resolution, by blending the compound which generates the acid by irradiation of the active light [component (b)] and the compound capable of being crosslinked or polymerized by the action of the acid [component (c)] with the heat-resistant polymer [component (a)].

Each component will be described below.
[Component (a)]

The component (a) in the present invention is not particularly limited as long as it has the phenolic hydroxyl group at the terminal and is soluble in the alkali aqueous solution. The phenolic hydroxyl group at the terminal becomes a crosslinking point, and a crosslinking reaction of the component (c) efficiently progresses in the presence of an acid catalyst. The component (a) mainly contributes to enhancement of the sensitivity and the enhancement of the heat resistance and the mechanical property of a cured film.

Here, the alkali aqueous solution is an alkali solution, e.g., an aqueous solution of tetramethylammonium hydroxide, an aqueous solution of metal hydroxide, an aqueous solution of organic amine, and the like. In general, the aqueous solution of tetramethylammonium hydroxide at a concentration of 2.38% by weight is used. Thus, it is preferable that the component (a) is soluble in this aqueous solution.

One criterion for determining that the component (a) is soluble in an alkaline developing solution will be described below. A varnish obtained by dissolving the component (a) alone or together with the components (b) and (c) described later in an arbitrary solvent is spin-coated on a substrate such as a silicon wafer to form a coating having a film thickness of about 5 μm. This is immersed in any one of the aqueous solution of tetramethylammonium hydroxide, the aqueous solution of metal hydroxide and the aqueous solution of organic amine at 20 to 25° C. As a result, when the component can be dissolved as a homogenous solution, it is determined that the component (a) used is soluble in the alkaline developing solution.

It is preferable in terms of workability and heat resistance that the above component (a) is a polymer compound selected from polyimide, polyoxazole, polyamideimide, polyamide, polyamic acid, polyamic acid ester and polyhydroxyamide. It is more preferable in terms of solubility in the alkali aqueous solution that the component (a) has the structure having multiple phenolic hydroxyl groups and carboxyl groups. Also as the component (a), it is also possible to use a copolymer or a mixture of two or more thereof.

A terminal group having the phenolic hydroxyl group in the component (a) is not particularly structurally limited as long as it has the phenolic hydroxyl group. Preferable is a compound having the hydroxyl group at meta-position to a binding site (site of a binding chain in the left) with a polyimide main chain as shown in the following general formula (IV).

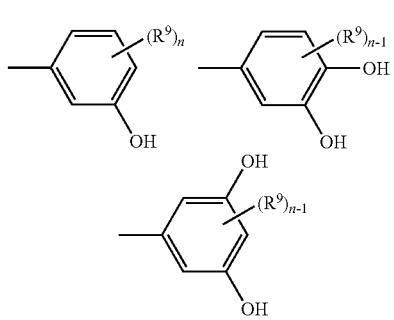

In the formula, $R^9$ each independently represents a monovalent organic group and n represents an integer of 1 to 4.

When the compound having a methylol or alkoxyalkyl group is used as the component (c), an ortho position of OH group becomes the crosslinking point. Thus, those having no substituent at ortho position of OH group are particularly preferable.

These terminal groups can be introduced into a main chain skeleton by using corresponding aminophenol, a hydroxybenzoic acid derivative, or the like.

In the component (a) used in the present invention, a number of the phenolic hydroxyl groups present at the terminal groups is preferably 1 to 6 and more preferably 2 to 4 with combining both termini. For a ratio of the terminal groups where the phenolic hydroxyl groups are present to a repeating unit, a molar ratio of the repeating unit (repeating unit composed of acid residues and amine residues) is preferably 1 to 100 and more preferably 2 to 50 relative to 2 of the terminal groups. When the ratio of the terminal groups is smaller than this, it is likely that the effect of the crosslinking reaction is reduced or the photosensitive property is decreased, which is not preferable. Conversely when the ratio is larger than this, it is likely that because of decrease of a molecular weight, even if the crosslinking reaction progresses sufficiently, sufficient film physical property is not obtained, which is not preferable.

The molar ratio of the acid residues to the amine residues is not particularly limited. When the terminal group is attributed to aminophenol, it is preferable that one more acid residues are present than the amine residues, and the ratio is preferably in the range of 100:99 to 2:1 and more preferably 50:49 to 3:2. When the terminal group is the hydroxybenzoic acid derivative, it is preferable that one less acid residues are present than the amine residues, and the ratio is preferably in the range of 99:100 to 1:2 and more preferably 49:50 to 2:3. They can be quantified by $^1$H NMR measurement.

The polymer which can be used as the component (a) and is soluble in the alkali aqueous solution will be further described. Polyimide can be obtained by, for example, reacting tetracarboxylic acid dianhydrate with diamine, and dehydrating and closing a ring. Polyoxazole can be obtained by, for example, reacting dicarboxylate dichloride with dihydroxydiamine, and dehydrating and closing the ring. Polyamideimide can be obtained by, for example reacting tricarboxylic acid with diamine, and dehydrating and closing the ring. Polyamide can be obtained by, for example, reacting dicarboxylate dichloride with diamine. Polyamic acid can be obtained by, for example, reacting tetracarboxylic acid dianhydrate with diamine. Polyamic acid ester can be obtained by, for example, reacting tetracarboxylate diester dichloride with diamine.

Among them currently, polyhydroxyamide capable of closing the ring to make polybenzoxazole by heating is often used as the electronic parts which are excellent in heat resistance, mechanical property and electric property. This polyhydroxyamide has the repeating unit represented by the following general formula (V). An amide unit containing hydroxy group is finally converted into an oxazole body which is excellent in heat resistance, mechanical property and electric property by closing the ring upon curing.

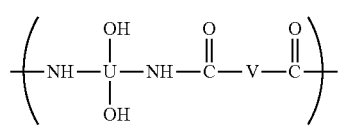

In the formula, U represents a tetravalent organic group and V represents a bivalent organic group.

Polyhydroxyamide which can be used in the present invention and has the repeating unit represented by the general formula (V) could have the above repeating unit. However, since the solubility of polyhydroxyamide in the alkali aqueous solution is derived from the phenolic hydroxyl group, it is preferable to contain the amide unit containing the hydroxy group to some extent or more.

That is, polyhydroxyamide represented by the following formula (VI) is preferable.

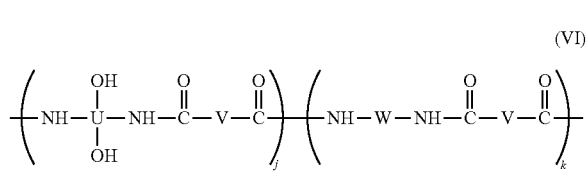

In the formula, U represents the tetravalent organic group, V and W represent the bivalent organic groups, j and k represent molar fractions.

In this general formula (VI), a sum of j and k is 100 mol %, j is preferably 60 to 100 mol % and k is preferably 40 to 0 mol %. For the molar fractions of j and k, more preferably j is 80 to 100 mol % and k is 20 to 0 mol %.

In the present invention, polyamide having the repeating unit represented by the general formula (V) can be generally synthesized from a dicarboxylic acid derivative and hydroxy group-containing diamines. Specifically, it is synthesized by converting the dicarboxylic acid derivative into a dihalide derivative and subsequently reacting with the diamines. The dihalide derivative is preferably a dichloride derivative.

The dichloride derivative can be synthesized by allowing a halogenating agent to act upon the dicarboxylic acid derivative. As the halogenating agent, it is possible to use thionyl chloride, phosphoryl chloride, phosphorus oxychloride and phosphorus pentachloride which are used for a usual acid chlorination reaction of carboxylic acid.

The dichloride derivative can be synthesized by reacting the dicarboxylic acid derivative with the above halogenating agent in a solvent or reacting in the excessive halogenating agent and subsequently distilling off the excessive agent. As the reaction solvent, it is possible to use N-methyl-2-pyrrolidone, N-methyl-2-pyridone, N,N-dimethylacetamide, N,N-dimethylformamide, toluene, benzene, and the like.

The amount of the halogenating agent to be used is preferably 1.5 to 3.0 mol and more preferably 1.7 to 2.5 mol in the case of reacting in the solvent, and is preferably 4.0 to 50 mol and more preferably 5.0 to 20 mol in the case of reacting in the halogenating agent, relative to the amount of the dicarboxylic acid derivative. A reaction temperature is preferably −10 to 70° C. and more preferably 0 to 20° C.

It is preferable that the reaction of the dichloride derivative and diamines is performed in the organic solvent in the presence of a dehydrohalogenation agent. As the dehydrohalogenation agent, typically organic bases such as pyridine and triethylamine are used. As the organic solvent, it is possible to use N-methyl-2-pyrrolodone, N-methyl-2-pyridone, N,N-dimethylacetamide, N,N-dimethylformamide, and the like. The reaction temperature is preferably −10 to 30° C. and more preferably 0 to 20° C.

Here, the tetravalent organic group represented by U on the above general formulae (V) and (VI) is generally a diamine residue which reacts with dicarboxylic acid to form a polyamide structure and has the structure in which two hydroxy groups are each located at ortho position of amine, and is preferably a tetravalent aromatic group, preferably has 6 to 40 carbon atoms, and the tetravalent aromatic group having 6 to 40 carbon atoms is more preferable. As the tetravalent aromatic group, those in which all four binding sites are present on an aromatic ring are preferable.

Such diamines may include but are not limited to 3,3'-diamino-4,4'-dihydroxybiphenyl, 4,4'-diamino-3,3'-dihydroxybiphenyl, bis(3-amono-4-hydroxyphenyl)propane, bis(4-amono-3-hydroxyphenyl)propane, bis(3-amono-4-hydroxyphenyl)sulfone, bis(4-amono-3-hydroxyphenyl)sulfone, 2,2-bis(3-amino-4-hydroxyphenyl)-1,1,1,3,3,3-hexafluoropropane, and 2,2-bis(4-amino-3-hydroxyphenyl)-1,1,1,3,3,3-hexafluoropropane. These compounds can be used alone or in combination of two or more.

The bivalent organic group represented by W in the above general formula (VI) is generally a diamine residue which reacts with dicarboxylic acid to form the polyamide structure, is the residue other than diamine which forms the above U, is preferably a bivalent aromatic or aliphatic group, preferably has 4 to 40 carbon atoms, and is more preferably the bivalent aromatic group having 4 to 40 carbon atoms.

Such diamines may include but are not limited to, aromatic diamine compounds such as 4,4'-diaminodiphenylether, 4,4'-diaminodiphenylmethane, 4,4'-diaminodiphenylsulfone, 4,4'-diaminodiphenylsulfide, benzidine, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis(4-aminophenoxy) biphenyl, bis[4-(4-aminophenoxy)phenyl]ether and 1,4-bis(4-aminophenoxy)benzene, and additionally LP-7100, X-22-161AS, X-22-161A, X-22-161B, X-22-161C and X-22-161E (supplied from Shin-Etsu Chemical Co., Ltd., product names) as diamine having a silicone group(s). These compounds can be used alone or in combination of two or more.

The bivalent organic group represented by V in the general formulae (V) and (VI) is a dicarboxylic acid residue which reacts with diamine to form the polyamide structure, is preferably a bivalent aromatic group, preferably has 6 to 40 carbon atoms, and is more preferably the bivalent aromatic group having 6 to 40 carbon atoms. As the bivalent aromatic group, those in which all two binding sites are present on the aromatic ring are preferable.

Such dicarboxylic acids may include but are not limited to, aromatic dicarboxylic acids such as isophthalic acid, terephthalic acid, 2,2-bis(4-carboxyphenyl)-1,1,1,3,3,3-hexafluoropropane, 4,4'-dicarboxybiphenyl, 4,4'-dicarboxydiphenylether, 4,4'-dicarboxytetraphenylsilane, bis(4-carboxyphenyl)sulfone, 2,2-bis(p-carboxyphenyl)propane, 5-tert-butylisophthalic acid, 5-bromoisophthalic acid, 5-fluoroisophthalic acid, 5-chloroisophthalic acid and 2,6-naphthalenedicarboxylic acid, as well as aliphatic dicarboxylic acids such as 1,2-cyclobutanedicarboxylic acid, 1,4-cyclohexanedicarboxylic acid, 1,3-cyclopentanedicarboxylic acid, oxalic acid, malonic acid and succinic acid. These compounds can be used alone or in combination of two or more.

The molecular weight of the component (a) is preferably 3,000 to 200,000 and more preferably 5,000 to 100,000 as a weight average molecular weight. Here, the molecular weight is a value obtained by measuring by gel permeation chromatography and converting from a standard polystyrene standard curve.

[Component (b)]

In the negative-type photosensitive resin composition according to the present invention, the compound which generates the acid by irradiation of the active light (hereinafter referred to as an acid generator) is used as the component (b) together with the polymer used as the component (a) which has the phenolic hydroxyl group at the terminal group and is soluble in the alkali aqueous solution. In order to make the sensitivity and the resolution good upon exposure, the amount of the component (b) to be blended is preferably 0.01 to 50 parts by weight, more preferably 0.01 to 20 parts by weight and still more preferably 0.5 to 20 parts by weight relative to 100 parts by weight of the component (a).

The acid generator (b) used in the present invention exhibits an acidity by irradiation of the active light such as ultraviolet light as well as crosslinks the component (c) with the polyamide derivative which is the component (a) or polymerizes the components (c) one another by its action. As compounds of such a component (b), specifically diarylsulfonium salts, triarylsulfonium salts, dialkylphenacylsulfonium salts, diaryliodonium salts, aryldiazonium salts, aromatic tetracarboxylate ester, aromatic sulfonate ester, nitrobenzyl ester, oxime sulfonate ester, aromatic N-oxyimidesulfonate, aromatic sulfamide, haloalkyl group-containing hydrocarbon compounds, haloalkyl group-containing heterocyclic compounds, naphthoquinonediazide-4-sulfonate ester, and the like are used.

Such compounds can be used in combination of two or more or in combination with an another sensitizer if necessary. Among them, aromatic oxime sulfonate ester and aromatic N-oxyimidesulfonate are preferable because the effect in terms of high sensitivity can be anticipated.

[Component (c)]

The compound (c) which can crosslink or polymerize by the action of the acid used in the negative-type photosensitive resin composition according to the present invention is preferably the compound having at least one methylol or alkoxyalkyl group in the molecule. Alternatively, the compound (c) is selected from the compound having two or more methylol, alkoxymethyl, epoxy or vinyl ether groups in the molecule and binding these groups to a benzene ring, or melamine resins and urea resins substituted with the methylol and/or alkoxymethyl groups at N position. Among them, the compound having the methylol or alkoxymethyl group is preferable in terms of sensitivity and stability of the varnish and in addition, preventing melting of the film upon curing the film after forming the pattern.

These compounds which can be used for the present invention are not particularly limited, but those represented by the following general formula (I) or (III) are preferable because the sensitivity and the effect of preventing the melting upon curing the exposed region are well-balanced.

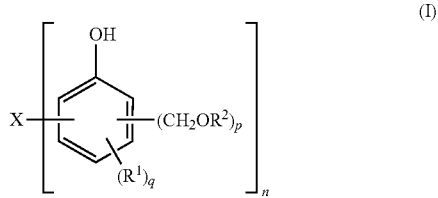
(I)

In the formula, X represents a single bond or a monovalent to tetravalent organic group; $R^1$ in number q each independently represent a monovalent organic group; $R^2$ in number p each independently represent a hydrogen atom or a monovalent organic group, n is an integer of 1 to 4; and p and q are each independently integers of 1 to 4.

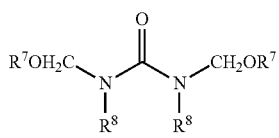
(III)

In the formula, multiple $R^7$ and $R^8$ each independently represent a hydrogen atom or a monovalent organic group.

In the general formula (I), the organic group represented by X may include hydrocarbon groups and halogenated hydrocarbon groups, and more specifically alkylene groups such as methylene, ethylene and propylene having 1 to 10 carbon atoms, alkylidene groups such as ethylidene having 2 to 10 carbon atoms, arylene groups such as phenylene having 6 to 30 carbon atoms, groups obtained by substituting a part or all of hydrogen atoms in these hydrocarbon groups with halogen atoms such as fluorine atoms, sulfone groups, carbonyl groups, ether bonds, thioether bonds and amide bonds. The bivalent organic group represented by the following general formula (VII) is included as preferable one.

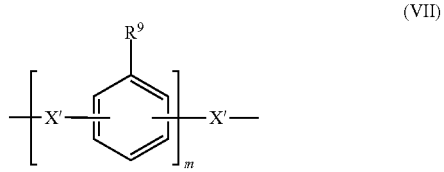
(VII)

In the formula, individual X' is each independently selected from a single bond, an alkylene group (e.g., having 1 to 10 carbon atoms), an alkylidene group (e.g., having 2 to 10 carbon atoms), a group obtained by substituting a part or all of hydrogen atoms in those groups with halogen atoms, a sulfone group, a carbonyl group, an ether bond, a thioether bond, an amide bond, and the like; $R^9$ represents a hydrogen atom, a hydroxy, alkyl or haloalkyl group, if multiple $R^9$ are present, they may be the same or different; and m is an integer of 1 to 10.

Those represented by the following general formula (II) are excellent in sensitivity and resolution, and thus are included as particularly preferable ones.

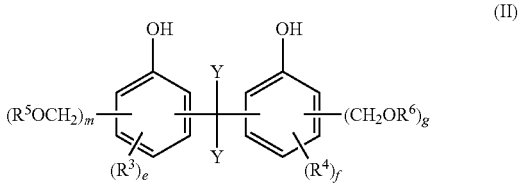
(II)

In the formula, two Y each independently represent hydrogen atoms or alkyl groups having 1 to 10 carbon atoms and may include oxygen or fluorine atoms; $R^3$ and $R^4$ each independently represent hydrogen atoms; $R^5$ and $R^6$ each independently represent hydrogen atoms or monovalent organic groups; m and g each independently represent integers of 1 to 3; and e and f each independently represent integers of 0 to 4.

Specifically, as Y in the general formula (II), those comprising the oxygen atom may include an alkyloxy group and those comprising the fluorine atom may include a perfluoroalkyl group. The organic groups represented by $R^5$ and $R^6$ may include specifically but are not limited to, methyl, ethyl, n-propyl, isopropyl, n-butyl, tert-butyl and amyl groups. Specific examples of the general formulae (I) and (II) may include those represented by the following chemical formulae (VIII).

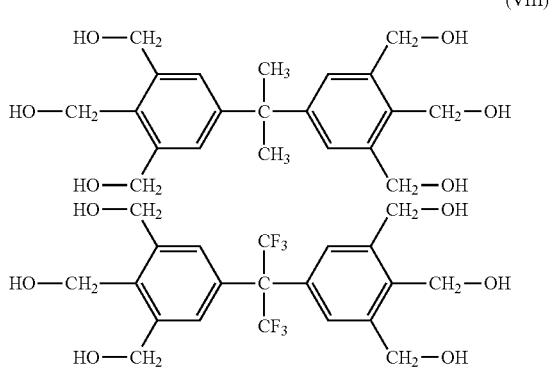
(VIII)

-continued

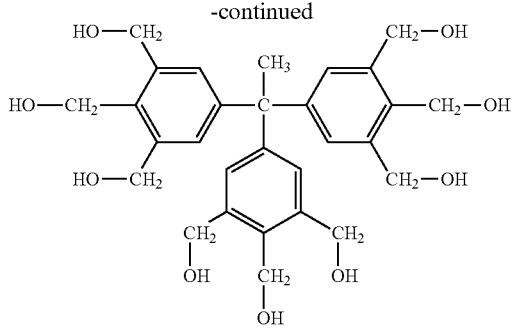

More preferable ones in terms of sensitivity in the general formula (III) may include those represented by the following chemical formulae (IX).

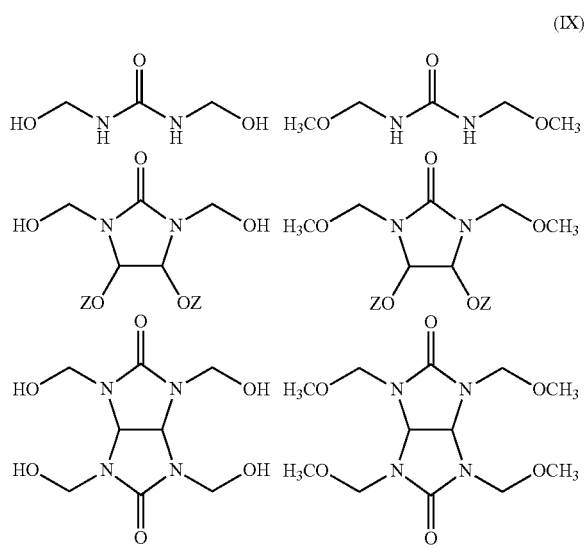

(IX)

Z represents a monovalent alkyl group having 1 to 10 carbon atoms.

In order to enhance the sensitivity and the resolution upon exposure and inhibit the melting of the pattern upon curing, the amount of the component (c) to be blended for using in the present invention is preferably 0.1 to 50 parts by weight, more preferably 0.1 to 20 parts by weight and still more preferably 0.5 to 20 parts by weight relative to 100 parts by weight of the component (a).

[Other Components: (1) Adhesiveness Imparting Agent]

The negative-type photosensitive resin composition according to the present invention can include an adhesiveness imparting agent such as an organic silane compound and an aluminium chelate compound for enhancing an adhesion property of the cured film to the substrate.

Examples of the organic silane compound may include vinyltriethoxysilane, γ-glycidoxypropyltriethoxysilane, γ-methacryloxypropyltrimethoxysilane, urea propyltriethoxysilane, methylphenylsilanediol, ethylphenylsilanediol, n-propylphenylsilanediol, isopropylphenylsilanediol, n-butylphenylsilanediol, isobutylphenylsilanediol, tert-butylphenylsilanediol, diphenylsilanediol, ethylmethylphenylsilanol, n-propylmethylphenylsilanol, isopropylmethylphenylsilanol, n-butylmethylphenylsilanol, iso-butylmethylphenylsilanol, tert-butylmethylphenylsilanol, ethyl-n-propylphenylsilanol, ethyl-isopropylphenylsilanol, n-butylethylphenylsilanol, iso-butylethylphenylsilanol, tert-butylethylphenylsilanol, methyldiphenylsilanol, ethyldiphenylsilanol, n-propyldiphenylsilanol, iso-propyldiphenylsilanol, n-butyldiphenylsilanol, iso-butyldiphenylsilanol, tert-butyldiphenylsilanol, phenylsilanetriol, 1,4-bis(trihydroxysilyl)benzene, 1,4-bis(methyldihydroxysilyl)benzene, 1,4-bis(ethyldihydroxysilyl)benzene, 1,4-bis(propyldihydroxysilyl)benzene, 1,4-bis(butyldihydroxysilyl)benzene, 1,4-bis(dimethylhydroxysilyl)benzene, 1,4-bis(diethylhydroxysilyl)benzene, 1,4-bis(dipropylhydroxysilyl)benzene, and 1,4-bis(dibutylhydroxysilyl)benzene.

Examples of the aluminium chelate compound may include tris(acetylacetonate)aluminium and acetyl acetate aluminium diisopropylate. The amount of the adhesiveness imparting agent when used is preferably 0.1 to 20 parts by weight and more preferably 0.5 to 10 parts by weight relative to 100 parts by weight of the component (a).

[Other Components: (2) Surfactant or Leveling Agent]

In order to enhance an applying property, e.g., preventing a striation (unevenness of film thickness), and enhance a developing property, an appropriate surfactant or leveling agent can be added to the negative-type photosensitive resin composition according to the present invention. As such a surfactant or a leveling agent, for example, polyoxyethylene lauryl ether, polyoxyethylene stearyl ether, polyoxyethylene oleyl ether and polyoxyethylene octylphenol ether are available. Commercially available products thereof may include Megafac F171, F173, R-08 (product names supplied from Dainippon Ink And Chemicals, Incorporated), Flourad FC430, FC431 (product names supplied from Sumitomo 3M Ltd.), and organosiloxane polymers KP341, KBM303, KBM403, KBM803 (product names supplied from Shin-Etsu Chemical Co., Ltd.).

[Other Components: (3) Solvent]

In the present invention, respective components of the aforementioned negative-type photosensitive resin composition are dissolved in a solvent to use in a varnish form. The solvents may include N-methyl-2-pyrrolidone, γ-butylolactone, N,N-dimethylacetamide, dimethylsulfoxide, 2-methoxyethanol, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol acetate, cyclohexanone, cyclopentane and tetrahydrofuran. These may be used alone or in mixture.

[Pattern Forming Method]

Subsequently, the pattern forming method according to the present invention will be described. In the pattern forming method according to the present invention, the desired pattern on the heat-resistant polymer can be formed by a step of applying the aforementioned negative-type photosensitive resin composition on a support substrate and drying it to form a photosensitive resin film, a step of exposing the photosensitive resin film obtained in the step of drying, a step of heating the photosensitive resin film after the exposure, a step of developing the photosensitive resin film after the heating using the alkali aqueous solution, and a step of treating the photosensitive resin film after the development with heat. Each step will be described below.

(Application, Drying (Film Forming) Step)

In the step of applying the aforementioned negative-type photosensitive resin composition on the support substrate and drying it, the aforementioned negative-type photosensitive resin composition is applied with rotation using a spinner on the support substrate such as a glass substrate, a semiconductor, a metal oxide insulator (e.g., $TiO_2$, $SiO_2$ and the like) or silicon nitride. Subsequently, by drying using a hotplate or an oven, the photosensitive resin film which is a coating of the negative-type photosensitive resin composition is formed on the support substrate.

(Exposure Step)

Subsequently, in the exposure step, the active light such as ultraviolet light, visible light or radiation light is irradiated through a mask to the photosensitive resin film which has become the coating on the support substrate.

(Development Step)

Subsequently, in the development step, the pattern is obtained by removing an exposed region with the developing solution. Examples of the developing solution may include the alkali aqueous solutions of sodium hydroxide, potassium hydroxide, sodium silicate, ammonia, ethylamine, diethylamine, triethylamine, triethanolamine and tetramethylammonium hydroxide as preferable ones. A base concentration in these aqueous solutions is preferably 0.1 to 10% by weight. Alcohols and surfactants can also be added to the above developing solution to use. They can be blended each preferably at 0.01 to 10 parts by weight and more preferably 0.1 to 5 parts by weight relative to 100 parts by weight of the developing solution.

(Heating Treatment Step)

Then, in the heating treatment step, the obtained pattern becomes the pattern of the heat-resistant polymer having an imide ring, an oxazole ring and other functional groups by preferably giving the treatment with heat at 150 to 450° C. using various thermal diffusion furnaces e.g., a heating furnace and a curing furnace.

(Microwave Cure)

Without limiting to the thermal diffusion furnace, it is also possible to use the microwave for the treatment with heat. When the microwave is irradiated in a pulse form with changing a frequency, an appearance of a stationary wave can be prevented. This is preferable in that the surface of the substrate can be evenly heated. Furthermore, when the substrate includes a metal wiring as the electronic parts, if the microwave is irradiated in the pulse form with changing the frequency, occurrence of electric discharge from the metal can be prevented. This is also preferable in that the electronic parts can be protected from breakdown.

In the negative-type photosensitive resin composition according to the present invention, when polyamic acid, polyamic acid ester and polyhydroxyamide are dehydrated and undergo a ring closure to convert into polyimide and polyoxazole, the frequency of the microwave to be irradiated is in the range of 0.5 to 20 GHz, practically 1 to 10 GHz and more preferably 2 to 9 GHz.

It is desirable to continuously change the frequency of the irradiated microwave, but actually the microwave is irradiated with changing the frequency stepwise. At that time, when a time period for which the microwave with a single frequency is irradiated is shorter, the stationary wave and the electric discharge from the metal more hardly occur. Thus, the time period is preferably 1 millisecond or less and particularly preferably 100 microseconds or less.

An output power of the microwave to be irradiated varies depending on a size of an apparatus and the amount of a body to be heated, and is in the range of approximately 10 to 2000 W, practically preferably 100 to 1000 W, more preferably 100 to 700 W, and most preferably 100 to 500 w. When the output power is 10 W or less, it is difficult to heat the body to be heated in a short time, and when it is 2000 W or more, the rapid elevation of temperature easily occurs.

It is preferable that the microwave irradiated is turned on and off in the pulse form, when polyamic acid and polyhydroxyamide are dehydrated and undergo the ring closure to convert into polyimide and polyoxazole in the negative-type photosensitive resin composition according to the present invention. By irradiating the microwave in the pulse form, it is possible to keep a set temperature for heating and avoid damage to a polyoxazole thin film and the substrate. This is preferable in these points. The time period for which the microwave in the pulse form is irradiated at one time varies depending on the condition, and is approximately 10 seconds or less.

The time period for which polyamic acid and polyhydroxyamide are dehydrated and undergo the ring closure to convert into polyimide and polyoxazole in the negative-type photosensitive resin composition of the present invention is the time period until dehydration and ring closure reactions progress sufficiently, and is approximately 5 hours or less in view of working efficiency. Any of the conditions in air or under the atmosphere of inert gas such as nitrogen can also be selected as the atmosphere for the dehydration and the ring closure.

In this way, if polyamic acid and polyhydroxyamide are dehydrated and undergo the ring closure in the negative-type photosensitive resin composition according to the present invention by irradiating the microwave under the aforementioned condition to the substrate having the negative-type photosensitive resin composition according to the present invention as the layer, also even by the dehydration and ring closure process at low temperature with the microwave, polyimide or polyoxazole having physical properties not different from those obtained by the dehydration and ring closure process at high temperature using the thermal diffusion furnace is obtained.

[Process for Producing Semiconductor Apparatus]

Subsequently a process for producing a semiconductor apparatus will be described as one example of the pattern forming method according to the present invention based on the drawings. FIG. 1-1 to FIG. 1-5 are schematic sectional views showing the process for producing the semiconductor apparatus having a multilayer wiring structure. In FIG. 1-1 to FIG. 1-5, a semiconductor substrate 1 such as Si substrate having circuit elements (not shown in the figure) is coated with a protection film 2 such as silicon oxide film except for a predetermined region for the circuit elements, and a first conductor layer 3 is formed on the exposed circuit elements. An interlayer insulation film 4 of the polyimide resin or the like is formed on this semiconductor substrate 1 by spin coating method (FIG. 1-1).

Figures 1, 2:
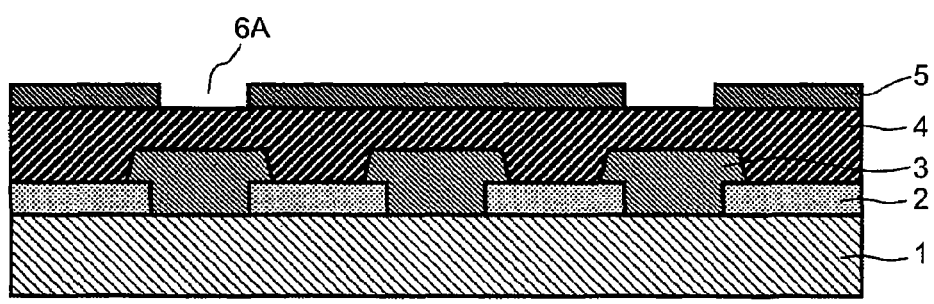
Figures 1, 2, 3:
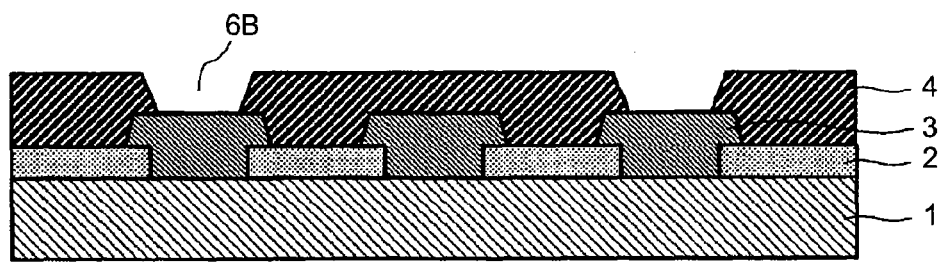
Figures 1, 2, 3, 4:
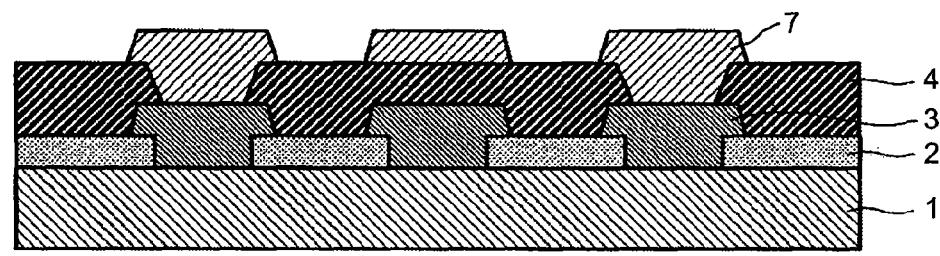
Figures 1, 2, 3, 4, 5:
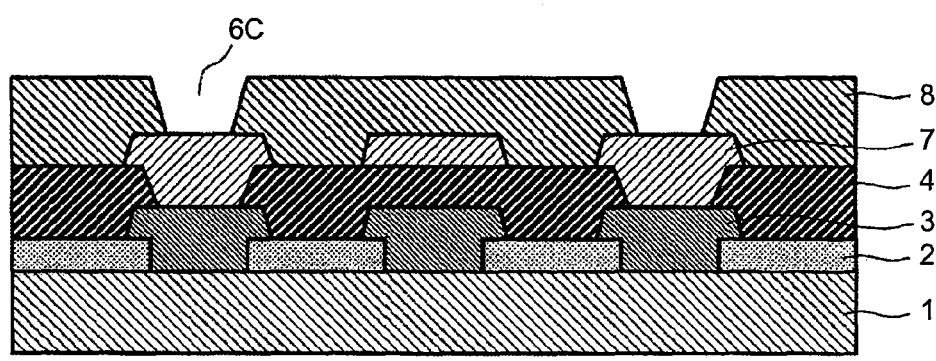
Figure 2:
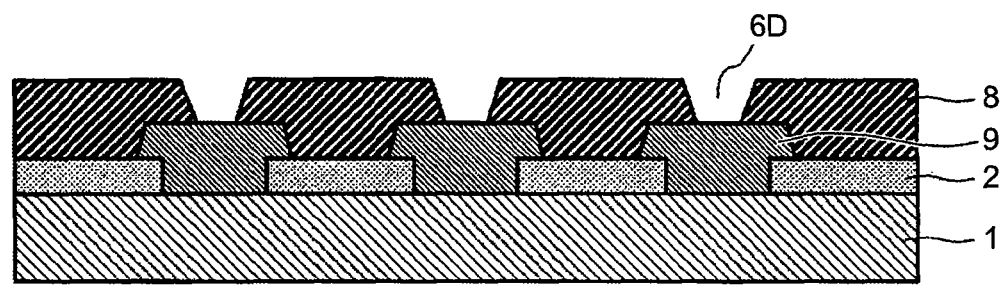

Subsequently, a chlorinated rubber based or phenol novolak based photosensitive resin layer 5 is formed as the musk on the interlayer insulation film 4 by the spin coating method, and windows 6A is provided by photo-etching technique known publicly so as to expose the interlayer insulation film 4 in the predetermined region (FIG. 1-2). The interlayer insulation film 4 in the window 6A is selectively etched by a dry etching procedure using a gas such as oxygen or carbon tetrafluoride to open windows 6B. Then, the photosensitive resin layer 5 is completely removed using an etching solution which corrodes only the photosensitive resin layer 5 without corroding the first conductor layer 3 exposed from the window 6B (FIG. 1-3). Furthermore, using the photo-etching technique known publicly, a second conductor layer 7 is formed to be electrically connected with the first conductor layer 3 completely (FIG. 1-4).

Subsequently, a surface protection film 8 is formed. In the example in FIG. 1-1 to FIG. 1-5, the negative-type photosensitive resin composition according to the present invention is applied and dried on the interlayer insulation film 4 and the second conductor layer 7 by the spin coating method. Subsequently, the light is irradiated from above the mask on which a pattern forming the window 6C has been depicted in the predetermined region, and then the pattern is formed by developing in the alkali aqueous solution. Subsequently, a heat-resistant polymer film as the surface protection film 8 is formed by heating (curing) (FIG. 1-5). This heat-resistant polymer film protects the conductor layers from stress and α-ray from outsides, and the resulting semiconductor apparatus is excellent in reliability.

When the multilayer wiring structure having three layer or more is formed, the above steps are repeated to form respective layers. That is, by repeating the step of forming the interlayer insulation film 4 and the step of forming the surface protection layer 8, it is possible to form the multilayer pattern. In the above example, it is possible to form not only the surface protection film 8 but also the interlayer insulation film 4 using the negative-type photosensitive resin composition according to the present invention.

[Electronic Parts]

Subsequently, the electronic parts according to the present invention will be described. The electronic parts according to the present invention have the pattern formed by the above pattern forming method using the negative-type photosensitive resin composition. Here, the electronic parts include semiconductor apparatuses, multilayer wiring plates and various electronic devices. The above pattern can be used specifically for forming the surface protection film and the interlayer insulation film in the semiconductor apparatus, and the interlayer insulation film in the multilayer wiring plate.

The negative-type photosensitive resin composition according to the present invention can be used for the electronic parts in the semiconductor apparatus and the multilayer wiring plate, and specifically can be used for forming the surface protection film and the interlayer insulation film in the semiconductor apparatus, and the interlayer insulation film in the multilayer wiring plate. The semiconductor apparatus according to the present invention is not particularly limited except for having the surface protection film and the interlayer insulation film formed using the above composition, and can take the various structures.

EXAMPLES

The present invention will be specifically described with reference to the following Examples and Comparative Examples, but the present invention is not limited thereto.

Examples 1 to 31

Synthesis Example 1

Synthesis of Polybenzoxazole Precursor

In a 0.5 liter flask equipped with a stirrer and a thermometer, 15.48 g (60 mmol) of 4,4'-diphenylether dicarboxylic acid and 90 g of N-methylpyrrolidone were placed, the flask was cooled to 5° C., subsequently 23.9 g (120 mmol) of thionyl chloride was dripped, and the mixture was reacted for 30 minutes to yield a solution of 4,4'-diphenylether tetracarboxylic acid chloride. Then, in a 0.5 liter flask equipped with a stirrer and a thermometer, 87.5 g of N-methylpyrrolidone was placed, 18.30 g (50 mmol) of bis(3-amino-4-hydroxyphenyl)hexafluoropropane and 2.18 g (20 mmol) of m-aminophenol were added, stirred and dissolved, and subsequently 9.48 g (120 mmol) of pyridine was added. With keeping the temperature at 0 to 5° C., the solution of 4,4'-diphenylether dicarboxylic acid chloride was dripped over 30 minutes, and the mixture was continued to be stirred for 30 minutes. The solution was poured in 3 liters of water, a precipitate was collected, washed three times with purified water, and dried under reduced pressure to yield polyhydroxyamide (hereinafter, referred to as a polymer I).

The polymer I had a weight average molecular weight of 17,600 and a dispersion degree of 1.6 calculated from standard polystyrene conversion by GPC method.

Synthesis Example 2

The synthesis was performed in the same way as in Synthesis Example 1, except that 50 mol % of 4,4'-diphenylether dicarboxylic acid used in Synthesis Example 1 was replaced with cyclohexane-1,4-dicarboxylic acid.

The resulting polyhydroxyamide (hereinafter referred to as a polymer II) had the weight average molecular weight of 18,580 and the dispersion degree of 1.5 calculated from the standard polystyrene conversion.

Synthesis Example 3

Synthesis of Polyimide Precursor

In the 0.2 liter flask equipped with the stirrer and the thermometer, 10 g (32 mmol) of 3,3',4,4'-diphenylether tetracarboxylic acid dianhydrate (ODPA) and 3.87 g (65 mmol) of isopropyl alcohol were dissolved in 45 g of N-methylpyrrolidone, a catalytic amount of 1,8-diazabicycloundecene was added thereto, then the mixture was heated at 60° C. for 2 hours, and subsequently stirred under room temperature (25° C.) for 15 hours to esterify.

Subsequently, 7.61 g (64 mmol) of thionyl chloride was added under ice-cooling, the temperature was backed to the room temperature, and the reaction was performed for 2 hours to yield a solution of acid chloride. Then, in the 0.5 liter flask equipped with the stirrer and the thermometer, 40 g of N-methylpyrrolidone was placed, 10.25 g (28 mmol) of bis(3-amino-4-hydroxyphenyl)hexafluoropropane and 0.87 g (8 mmol) of m-aminophenol were added, stirred and dissolved, and subsequently 7.62 g (64 mmol) of pyridine was added. With keeping the temperature at 0 to 5° C., the solution of acid chloride prepared previously was dripped over 30 minutes, and the stirring was continued for 30 minutes. This reaction solution was dripped in distilled water, a precipitate was collected by filtration and dried under reduced pressure to yield polyamic acid ester (hereinafter referred to as a polymer III).

The polymer III had the weight average molecular weight of 19,400 and an esterification rate of polyamic acid calculated from NMR spectrum was 100%.

Synthesis Example 4

Synthesis of Polyimide Precursor

In the 0.5 liter flask equipped with the stirrer and the thermometer, 60 g of N-methylpyrrolidone was placed, 10.25 g (28 mmol) of bis(3-amino-4-hydroxyphenyl)hexafluoropropane and 0.87 g (8 mmol) of m-aminophenol were added, stirred and dissolved. Under the room temperature, 14.21 g (32 mmol) of 2,2'-bis(3,4-dicarboxyphenyl)hexafluoropropane dianhydrate (6FDA) was added thereto over 30 minutes, and the stirring was continued for 12 hours. This reaction solution (reaction solution A) was dripped in distilled water, a precipitate was collected by filtration and dried under reduced pressure to yield polyamic acid (hereinafter referred to as a polymer IV).

Its weight average molecular weight was 16,800.

Synthesis Example 5

Synthesis of Polyimide Body

To the reaction solution A obtained in Synthesis Example 4, 20 g of m-xylene was added, and the mixture was refluxed with heating at 150° C. for 2 hours. At that time, the reflux was performed while the water generated by cyclization of an imide ring was removed out of the system by azeotropy. Subsequently, the reaction solution was cooled to the room temperature, this reaction solution was dripped in distilled water, a precipitate was collected by filtration and dried under reduced pressure to yield polyimide (hereinafter referred to as a polymer V).

Its weight average molecular weight was 15,500.

[Evaluation of Photosensitive Property]

Solutions of the negative-type photosensitive resin compositions were obtained by combining the components (b) and (c) at predetermined amounts shown in Table 1 to each 100 parts by weight of the above polymers I to V as the component (a). γ-Butyrolactone was used as the solvent, and the amount thereof at 1.5 times weight relative to the weight of the polymer was used.

TABLE 1

| Item | Component (a) | Component (b) | Component (c) |
|---|---|---|---|
| Example 1 | polymer I | B1 (5) | C1 (5) |
| Example 2 | polymer I | B2 (5) | C1 (5) |
| Example 3 | polymer I | B1 (5) | C2 (5) |
| Example 4 | polymer I | B1 (5) | C3 (5) |
| Example 5 | polymer I | B2 (5) | C3 (5) |
| Example 6 | polymer I | B1 (5) | C4 (5) |
| Example 7 | polymer I | B1 (5) | C5 (5) |
| Example 8 | polymer I | B2 (5) | C5 (5) |
| Example 9 | polymer I | B1 (5) | C6 (5) |
| Example 10 | polymer I | B2 (5) | C6 (5) |
| Example 11 | polymer I | B1 (5) | C7 (5) |
| Example 12 | polymer I | B2 (5) | C8 (5) |
| Example 13 | polymer I | B1 (5) | C9 (5) |
| Example 14 | polymer I | B2 (5) | C9 (5) |
| Example 15 | polymer I | B1 (5) | C10 (5) |
| Example 16 | polymer I | B2 (5) | C11 (5) |
| Example 17 | Polymer II | B1 (5) | C1 (5) |
| Example 18 | Polymer II | B1 (5) | C5 (5) |
| Example 19 | Polymer II | B2 (5) | C3 (5) |
| Example 20 | Polymer II | B2 (5) | C8 (5) |
| Example 21 | Polymer III | B1 (5) | C2 (3) + C3 (5) |
| Example 22 | Polymer III | B1 (5) | C4 (5) |
| Example 23 | Polymer III | B1 (5) | C6 (5) |
| Example 24 | Polymer III | B2 (5) | C9 (5) |
| Example 25 | Polymer IV | B1 (5) | C7 (5) |
| Example 26 | Polymer IV | B2 (5) | C8 (5) |
| Example 27 | Polymer IV | B2 (5) | C10 (5) |
| Example 28 | Polymer V | B1 (5) | C5 (5) |
| Example 29 | Polymer V | B1 (5) | C6 (5) |
| Example 30 | Polymer V | B1 (5) | C9 (5) |
| Example 31 | Polymer V | B2 (5) | C11 (5) |

In the table, a number in a parenthesis in the components (b) and (c) represents the added amount in parts by weight relative to 100 parts by weight of respective polymers I to V which are the components (a) (the same as the above). B1 and B2 used as the component (b) and C1 to C11 used as the component (c) are the compounds represented by the following formulae (X) and (XI).

(X) 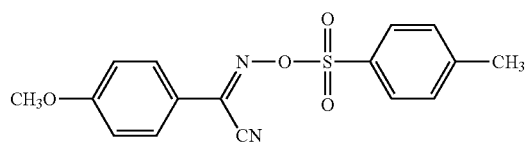

B1

(XI) 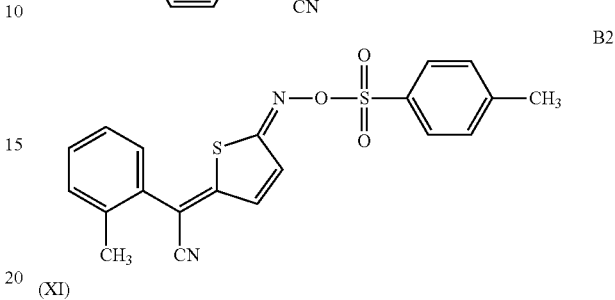

B2

C1

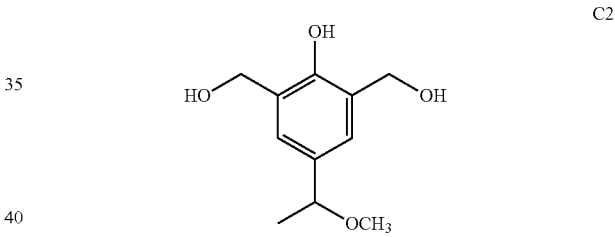

C2

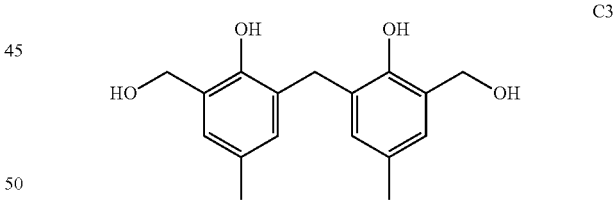

C3

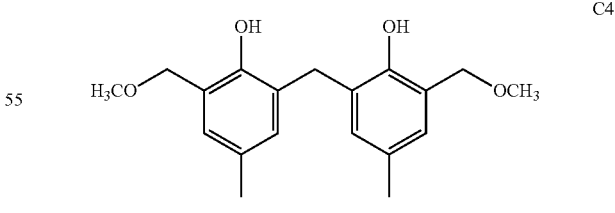

C4

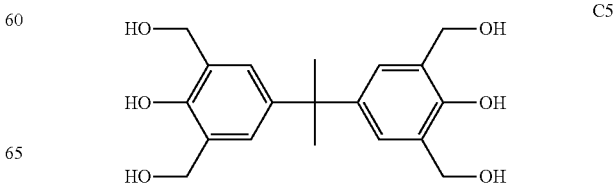

C5

-continued

C6
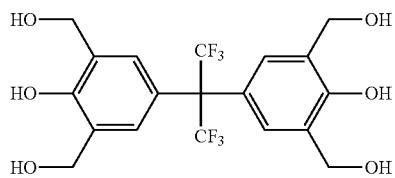

C7
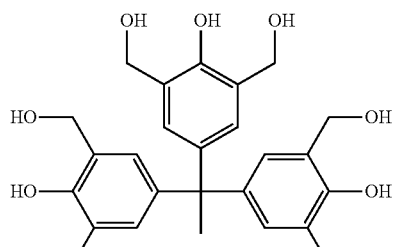

C8
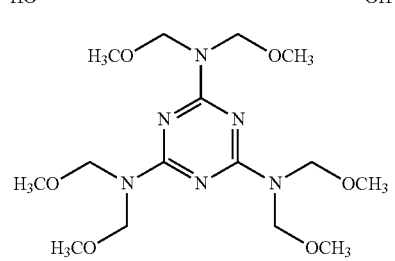

C9
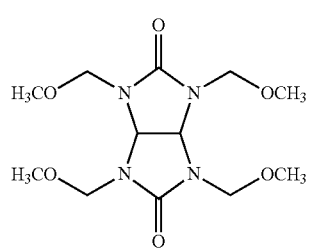

C10
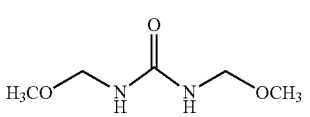

C11
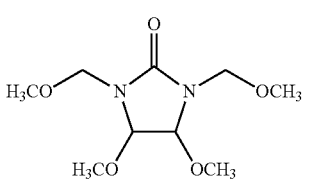

The solution of the negative-type photosensitive resin composition in the above each Example was spin-coated on a silicon wafer to form a coating having a dry film thickness of 3 to 10 μm, and subsequently the coating was exposed to i-ray (365 nm) from an ultrahigh pressure mercury lamp through an interference filter. After the exposure, the coating was heated at 120° C. for 3 minutes, and developed in an aqueous solution of 2.38% by weight tetramethylammonium hydroxide until the silicon wafer in an exposed region was bared. Then, the coating was rinsed to obtain a minimum exposure amount (sensitivity) and a resolution required for forming the pattern in which 90% or more of a residual film ratio (ratio of film thickness values before and after the development) was obtained. The results are collectively shown in Table 2.

TABLE 2

| Item | Sensitivity (mJ/cm$^2$) | Resolution (μm) |
|---|---|---|
| Example 1 | 350 | 6 |
| Example 2 | 380 | 5 |
| Example 3 | 250 | 6 |
| Example 4 | 230 | 5 |
| Example 5 | 280 | 4 |
| Example 6 | 220 | 5 |
| Example 7 | 150 | 4 |
| Example 8 | 170 | 4 |
| Example 9 | 280 | 5 |
| Example 10 | 300 | 4 |
| Example 11 | 380 | 6 |
| Example 12 | 450 | 5 |
| Example 13 | 150 | 5 |
| Example 14 | 170 | 4 |
| Example 15 | 430 | 6 |
| Example 16 | 300 | 6 |
| Example 17 | 270 | 6 |
| Example 18 | 110 | 5 |
| Example 19 | 240 | 4 |
| Example 20 | 300 | 5 |
| Example 21 | 230 | 5 |
| Example 22 | 210 | 4 |
| Example 23 | 260 | 5 |
| Example 24 | 240 | 3 |
| Example 25 | 290 | 5 |
| Example 26 | 240 | 4 |
| Example 27 | 260 | 4 |
| Example 28 | 220 | 4 |
| Example 29 | 270 | 4 |
| Example 30 | 210 | 4 |
| Example 31 | 250 | 4 |

As is evident from Table 2, in all Examples, the high sensitivity and the high resolution were obtained.

Furthermore for Examples 1, 3, 6, 7, 9, 10, 13, 14, 28 and 31, the solution of the negative-type photosensitive resin composition was spin-coated on the silicon wafer and heated at 120° C. for 3 minutes to form the coating having the film thickness of 15 nm.

Subsequently, the coating was heated at 150° C. for 30 minutes and further heated at 320° C. for one hour or at 225° C. for one hour under the nitrogen atmosphere in an inert gas oven to yield a cured film. Then, this cured film was detached using an aqueous solution of hydrofluoric acid, washed with water and dried. Its film physical properties such as a glass transition point (Tg), a breaking elongation (measured using a tensile tester) and a 5% weight loss temperature (Td) were measured. These results are shown in Table 3.

Furthermore for the cured film obtained by heating at 320° C., the film thickness values before and after curing were measured, and a cure shrinkage (cure shrinkage=loss amount of film thickness due to curing/film thickness before curing) was obtained and also shown in Table 3.

TABLE 3

| Item | Curing Temperature (° C.) | Tg (° C.) | Breaking Elongation (%) | Td (° C.) | Cure Shrinkage (%) |
|---|---|---|---|---|---|
| Example 1 | 320 | 278 | 31 | 483 | 21 |
| | 225 | 245 | 29 | 379 | — |
| Example 3 | 320 | 277 | 33 | 484 | 20 |
| | 225 | 241 | 28 | 382 | — |
| Example 6 | 320 | 286 | 34 | 495 | 20 |
| | 225 | 252 | 31 | 395 | — |
| Example 7 | 320 | 306 | 31 | 496 | 20 |
| | 225 | 257 | 28 | 388 | — |
| Example 9 | 320 | 315 | 36 | 488 | 19 |
| | 225 | 267 | 36 | 386 | — |

TABLE 3-continued

| Item | Curing Temperature (° C.) | Tg (° C.) | Breaking Elongation (%) | Td (° C.) | Cure Shrinkage (%) |
|---|---|---|---|---|---|
| Example 10 | 320 | 316 | 30 | 491 | 20 |
|  | 225 | 261 | 28 | 392 | — |
| Example 13 | 320 | 301 | 35 | 497 | 19 |
|  | 225 | 265 | 33 | 391 | — |
| Example 14 | 320 | 300 | 36 | 493 | 20 |
|  | 225 | 263 | 32 | 387 | — |
| Example 28 | 320 | 318 | 33 | 487 | 22 |
|  | 225 | 278 | 29 | 420 | — |
| Example 31 | 320 | 307 | 27 | 483 | 22 |
|  | 225 | 273 | 22 | 422 | — |

As shown in Table 3, the film physical properties comparable to those obtained by curing at 320° C. were also obtained by curing at 225° C. For the 5% weight loss temperature, slightly lower values were obtained by curing at 225° C., but were practically no problem.

Examples 32 to 39

Furthermore, concerning the materials used in Examples 1, 6, 7, 10, 13, 21, 25 and 26 shown in Table 1, the film physical properties were examined by changing the curing method. The solution of the negative-type photosensitive resin composition was spin-coated on the silicon wafer and heated at 120° C. for 3 minutes to form the coating having the film thickness of 15 μm. Subsequently, the coating was cured for 2 hours at a microwave output of 450 W and a microwave frequency of 5.9 to 7.0 GHz with keeping the substrate temperature at 250° C. using Microcure 2100 supplied from Lambda Technology to yield a cured film having the film thickness of 10 μm.

Then, this cured film was detached using the aqueous solution of hydrofluoric acid, washed with water and dried. The glass transition point (Tg), the breaking elongation and the 5% weight loss temperature (Td) were measured. These results are shown in Table 4.

TABLE 4

| Item | Photosensitive Resin Composition | Tg (° C.) | Breaking Elongation (%) | Td (° C.) |
|---|---|---|---|---|
| Example 32 | Material for Example 1 | 266 | 18 | 467 |
| Example 33 | Material for Example 6 | 270 | 20 | 473 |
| Example 34 | Material for Example 7 | 271 | 22 | 473 |
| Example 35 | Material for Example 10 | 279 | 18 | 471 |
| Example 36 | Material for Example 13 | 275 | 20 | 468 |
| Example 37 | Material for Example 21 | 278 | 17 | 473 |
| Example 38 | Material for Example 25 | 286 | 14 | 464 |
| Example 39 | Material for Example 26 | 281 | 17 | 471 |

As shown in Table 4, in the negative-type photosensitive resin composition according to the present invention, the satisfactory physical properties were also obtained by the method of irradiating the microwave in the pulse form with changing the frequency and with keeping the substrate temperature at 250° C. Thus, it was found that the dehydration and the ring closure of polyamide or polyimide occurred effectively and it was cured.

Comparative Examples 1 to 7

In the synthesis of the polymers I and III, the polymers obtained by synthesizing without using m-aminophenol were rendered the polymers VI and VII, respectively. The solution of the negative-type photosensitive resin composition was obtained by combining the components (b) and (c) in the predetermined amount shown in Table 5 to 100 parts by weight of the polymer as the component (a).

TABLE 5

| Item | Component (a) | Component (b) | Component (c) |
|---|---|---|---|
| Comparative Example 1 | polymer I | None | C1 (5) |
| Comparative Example 2 | polymer I | B1 (5) | None |
| Comparative Example 3 | polymer I | B1 (5) | C12 (5) |
| Comparative Example 4 | polymer I | B3 (10) | None |
| Comparative Example 5 | Polymer VI | B1 (5) | C1 (5) + C3 (5) |
| Comparative Example 6 | Polymer VI | B1 (5) | C4 (5) |
| Comparative Example 7 | Polymer VII | B1 (5) | C1 (5) + C3 (5) |

In Table 5, B3 used as the component (b) and C12 used as the component (c) are the compounds represented by the following formulae (XII) and (XIII), respectively.

(XII)

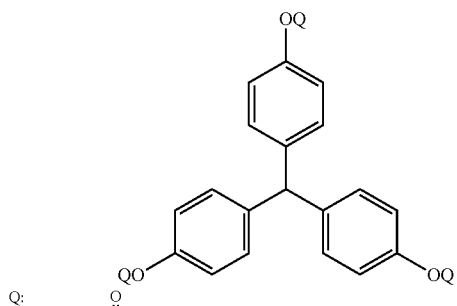

B3

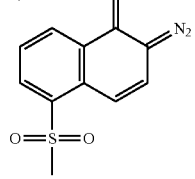

(XIII)

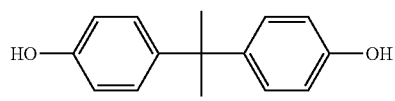

C12

The evaluation was performed below in the same way as in Examples. These results are shown in Table 6.

TABLE 6

| Item | Sensitivity (mJ/cm$^2$) | Resolution (μm) |
|---|---|---|
| Comparative Example 1 | No pattern was obtained. | |
| Comparative Example 2 | | |
| Comparative Example 3 | | |
| Comparative Example 4 | 420 (positive-type image) | 6 (positive-type image) |
| Comparative Example 5 | The residual film ratio of the exposed portion does not rise to 40 to 50% or more, and no good pattern was obtained. | |
| Comparative Example 6 | | |
| Comparative Example 7 | | |

As is evident from Table 6, in Comparative Examples 1 to 3, as a result, insolubilization due to the crosslinking reaction or the polymerization did not occur in the exposed region, and no pattern was obtained. In Comparative Example 4, a positive-type image was obtained, but the sensitivity and the residual film ratio were 420 mJ/cm$^2$ and 75%, respectively, which are low, and no good property was obtained. In Comparative Examples 5 to 7, a negative-type image was obtained, but the residual film ratio was much lower than those in Examples and was not improved even by increasing the exposure amount. It was found from this that the phenolic hydroxyl group at the terminal group contributed to enhancement of the photosensitive property.

The properties of the cured films in Comparative Examples 1, 5 and 7 were measured in the same way as the above. The results are shown in Table 7.

TABLE 7

| Item | Curing Temperature (° C.) | Tg (° C.) | Breaking Elongation (%) | Td (° C.) |
|---|---|---|---|---|
| Comparative Example 1 | 320 | 266 | 15 | 463 |
| | 225 | 213 | 3 | 281 |
| Comparative Example 5 | 320 | 274 | 6 | 477 |
| | 225 | 244 | No measurement was possible due to fragility. | 368 |
| Comparative Example 7 | 320 | 289 | 5 | 460 |
| | 225 | 231 | No measurement was possible due to fragility. | 331 |

As is evident from Table 7, all of the cured films were more fragile and Tg was inferior compared with Examples.

Comparative Example 8

The polymer IV was used as the component (a), and the cure shrinkage when cured at 320° C. was obtained in the same way as in Example. The amounts of the other blended components relative to 100 parts by weight of the polymer and the measurement results were shown in Table 8.

TABLE 8

| Item | Component (a) | Photoreaction Initiator | Crosslinking Agent | Cure Shrinkage (%) |
|---|---|---|---|---|
| Comparative Example 8 | polymerIV | B'4 (5) | C'13 (45) | 45 |

A photoreaction initiator B'4 and a crosslinking agent C'13 are the compounds represented by the following formulae (XIV) and (XV), respectively.

(XIV)

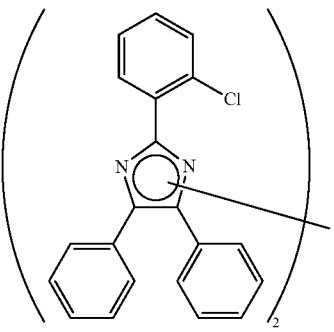

B'4

(XV)

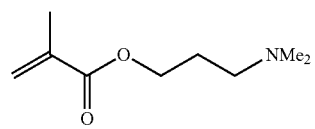

C'13

As shown in Table 8, in the evaluation of the photosensitive property performed in the same way as in Examples, the negative-type image could be obtained in Comparative Example 8 by using the organic solvent such as N-methyl-2-pyrrolidone as the developing solution, but the cure shrinkage was 45% which was extremely large.

INDUSTRIAL APPLICABILITY

As mentioned above, the negative-type photosensitive resin composition according to the present invention is excellent in sensitivity, resolution and heat resistance, and produces the good properties of the cured film even when thermally cured at low temperature of 200 to 300° C. In addition, the film shrinkage due to curing is small. Also according to the pattern forming method of the present invention, the pattern which is excellent in sensitivity, resolution and heat resistance and has the good shape is obtained by the use of the negative-type photosensitive resin composition. Furthermore in the present invention, the highly reliable electronic parts are obtained by having the pattern having the good shape and properties as the surface protection layer or the interlayer insulation film layer in the circuit. Therefore, the present invention is useful for the electronic parts such as electronic devices.

The invention claimed is:
1. A photosensitive resin composition comprising:
(a) a polymer that has a terminal group having a phenolic hydroxyl group and is soluble in an alkali aqueous solution, wherein the polymer is a polyoxazole precursor or a polyhydroxyamide;

(b) a second compound that generates an acid by irradiating active light, wherein the second compound is selected from the group consisting of aromatic oxime sulfonate ester, and aromatic N-oxyimidesulfonate; and
(c) a third compound that can be crosslinked or polymerized by an action of the acid, wherein the photosensitive resin composition is a negative-type photosensitive resin composition, and wherein the terminal group is any of the groups shown in formulae (IV) that has been introduced into a main chain skeleton by using corresponding aminophenol or a hydroxybenzoic acid derivative,

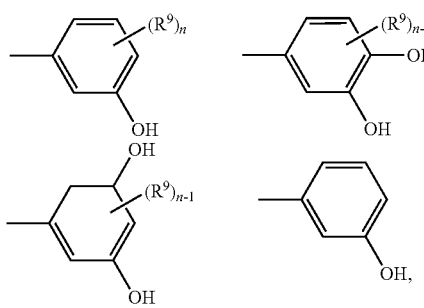

wherein $R^9$ each independently represents a monovalent organic group and n represents an integer of 1 to 4.

2. The photosensitive resin composition according to claim 1, wherein the component (c) is a compound having at least one methylol group or alkoxyalkyl group in a molecule.

3. The photosensitive resin composition according to claim 2, wherein the component (c) is a compound represented by a general formula (I):

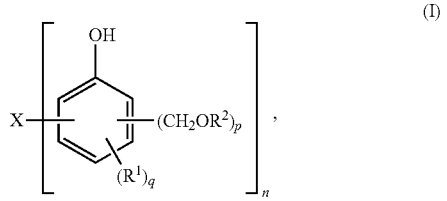

wherein X represents a single bond or a monovalent to tetravalent organic group; $R^1$ in number q each independently represent a monovalent organic group; $R^2$ in number p each independently represent a hydrogen atom or a monovalent organic group, n is an integer of 1 to 4; and p and q are each independently integers of 0 to 4.

4. The photosensitive resin composition according to claim 3, wherein the component (c) is a compound represented by the general formula (II):

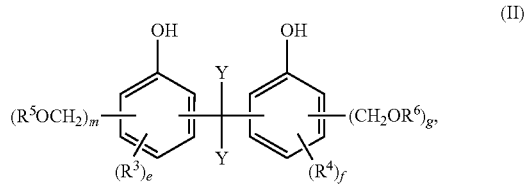

wherein two Y each independently represent a hydrogen atom or an alkyl group having 1 to 10 carbon atoms, an oxygen atom or a fluorine atom; $R^3$ and $R^4$ each independently represent a hydrogen atom; $R^5$ and $R^6$ each independently represent a hydrogen atom or a monovalent organic group; m and g each independently represent integers of 1 to 3; and e and f each independently represent integers of 0 to 4.

5. The photosensitive resin composition according to claim 2, wherein the component (c) is a compound represented by a general formula (III):

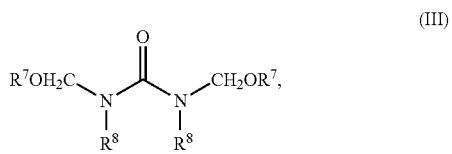

wherein multiple $R^7$ and $R^8$ each independently represent a hydrogen atom or a monovalent organic group.

6. The photosensitive resin composition according to claim 1, wherein 0.01 to 50 parts by weight of the compound (b) and 0.1 to 50 parts by weight of the component (c) are blended to 100 parts by weight of the component (a).

7. A pattern forming method comprising the steps of:
applying the photosensitive resin composition according to claim 1 on a support substrate and drying the photosensitive resin composition to form a photosensitive resin film;
exposing the photosensitive resin film obtained from applying and drying the photosensitive resin composition;
heating the photosensitive resin film after exposing the photosensitive resin film;
developing the photosensitive resin film after heating by using an alkali aqueous solution; and
heat-treating the photosensitive resin film after developing.

8. Electronic parts having a pattern layer obtained by the pattern forming method according to claim 7 as an interlayer insulation film layer or a surface protection layer.

9. The photosensitive resin composition according to claim 1, wherein the component (a) has the phenolic hydroxyl group at both termini thereof, and the number of the total phenolic hydroxyl groups at the terminal groups is 2 to 4.

10. The photosensitive resin composition according to claim 2, wherein the component (a) has no substituent at an ortho position of the phenolic hydroxyl group.

11. The photosensitive resin composition according to claim 2, wherein the terminal group of the component (a) is an aminophenol group or a hydroxybenzoic acid group.

12. The photosensitive resin composition according to claim 1, wherein the second compound (b) includes an additional compound selected from the group consisting of compounds represented by one of the following formulas B1 and B2,

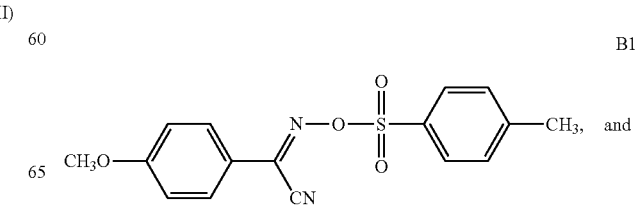

-continued

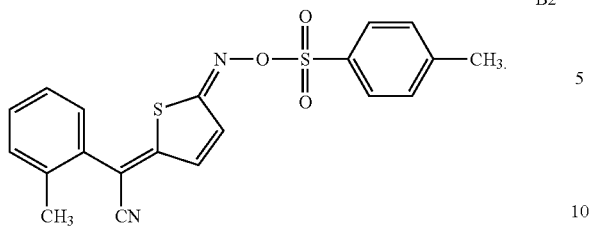

B2

13. The photosensitive resin composition according to claim 1, wherein once the composition is cured, the cured composition has a glass transition temperature of 245° C. to 318° C., a 5% weight loss temperature of 379° C. to 496° C., and a breaking elongation of 28% to 36%.

14. The photosensitive resin composition according to claim 1, wherein once the composition is cured, the cured composition has a glass transition temperature of 266° C. to 286° C., a 5% weight loss temperature of 464° C. to 473° C., and a breaking elongation of 14% to 22%.

* * * * *